US009739843B2

(12) United States Patent
Vervaeke

(10) Patent No.: US 9,739,843 B2
(45) Date of Patent: Aug. 22, 2017

(54) ARRANGEMENT AND METHOD FOR CHARACTERIZING MAGNETIC SYSTEMS

(75) Inventor: Koen Jozef Theo Vervaeke, Wilsele (BE)

(73) Assignee: MAGCAM NV, Heverlee (BE)

( * ) Notice: Subject to any disclaimer, the term of this patent is extended or adjusted under 35 U.S.C. 154(b) by 1134 days.

(21) Appl. No.: 13/371,949

(22) Filed: Feb. 13, 2012

(65) Prior Publication Data

US 2012/0209546 A1 Aug. 16, 2012

Related U.S. Application Data

(60) Provisional application No. 61/442,417, filed on Feb. 14, 2011.

(51) Int. Cl.
G06F 17/10 (2006.01)
G01R 33/10 (2006.01)
G01R 33/00 (2006.01)

(52) U.S. Cl.
CPC ..... G01R 33/0064 (2013.01); G01R 33/0094 (2013.01); G01R 33/10 (2013.01)

(58) Field of Classification Search
USPC .............................. 702/38, 57, 179, 182, 183
See application file for complete search history.

(56) References Cited

U.S. PATENT DOCUMENTS

| 2002/0043975 | A1* | 4/2002 | Aoki ............................ 324/309 |
| 2007/0170917 | A1* | 7/2007 | Thompson et al. .......... 324/307 |
| 2009/0128135 | A1* | 5/2009 | Masham ................ G01R 33/10 324/205 |

FOREIGN PATENT DOCUMENTS

| JP | 02222846 | A | | 5/1990 |
| JP | 09239537 | A | * | 9/1997 |
| JP | 2000046801 | A | | 2/2000 |
| JP | 2007163372 | A | | 6/2007 |

OTHER PUBLICATIONS

Engel-Herbert, R., et al., "Calculation of the Magnetic Stray Field of a Uniaxial Magnetic Domain", Journal of Applied Physics, 97, 074504, 2005. See Specification, p. 2.

(Continued)

*Primary Examiner* — Mohamed Charioui
(74) *Attorney, Agent, or Firm* — Bacon & Thomas, PLLC

(57) ABSTRACT

The present invention relates to a new method for characterizing magnets, magnetic assemblies (combinations of magnets) and magnetic materials. In what follows, these will be called under the common term 'magnetic systems'. The method is based on obtaining quantitative properties of the magnetic system by combining magnetic field measurement data and theoretical modeling or simulation data. The input parameters of the theoretical model are optimized using an optimization method in order to obtain a best fit to the measured data. In this method, the present invention involves precalculating magnetic field distributions prior to the optimization execution in order to considerably speed up the process. Combining this advanced data processing with fast magnetic field mapping using e.g. a magnetic field camera, allows real-time measurement and data analysis of magnetic systems for applications in e.g. quality control of such magnetic systems.

17 Claims, 7 Drawing Sheets

(56) References Cited

OTHER PUBLICATIONS

Tejedor, M., et al., "External Fields Created by Uniformly Magnetized Ellipsoids and Spheroids", IEEE Transactions on Magnetics, vol. 31, No. 1, Jan. 1995. See Specification, p. 2.
"Inline magnet inspection using fast high resolution MagCam magnetic field mapping and analysis", Vervaeke, Electric Drives Production Conference, Sep. 28, 2011.
Belgian Official Communication and Search Report for BE 20120662, dated Jun. 6, 2013.
Japanese Office Action for related JP 2012-028254, dated Nov. 12, 2013, and English translation thereof.

\* cited by examiner

Fig. 7

ARRANGEMENT AND METHOD FOR CHARACTERIZING MAGNETIC SYSTEMS

TECHNICAL FIELD OF THE INVENTION

The current invention is situated in the field of magnetic measurements and inspection, research, development and quality control of magnets, magnetic assemblies, magnetic materials (all of which called 'magnetic systems') and products involving such magnetic systems. More specifically, the present invention relates to a method to extract information from a two-dimensional mapping of the magnetic field of a magnetic system. This magnetic mapping can, in one embodiment, be obtained from a 'magnetic field camera' system, which is able to record high resolution 2D magnetic field maps at high speeds, which makes it possible to apply the process in e.g. fast quality control of magnetic systems. The extraction of information from the magnetic field map is done by comparing the measurement data to simulated or calculated data from a magnetic system, based on a magnetic model. The input parameters of the magnetic model are varied and optimized as to obtain a best fit to the measured data. The resulting optimized input parameters then give the extra information that is sought.

BACKGROUND OF THE INVENTION

Existing magnetic measurement techniques mostly measure one particular parameter of a magnet or magnetic system. A Gaussmeter e.g. measures the magnetic field at one position in space. A Helmholtz coil e.g. measures the integrated magnetic moment of a magnet. Recently a new magnetic measurement method and apparatus was invented, called a 'magnetic field camera', which is able to record high resolution 2D magnetic field maps at high speeds. This system consists of a semiconductor chip with an integrated 2D array of magnetic field sensors, which each independently measure the local magnetic field. The sensors in the array are closely spaced at very well defined relative distances, due to the well-controlled standard chip manufacturing process. The large number of pixels that independently measure the magnetic field result in a large amount of information contained within the resulting magnetic field map, which is not readily apparent and can only be extracted using advanced data analysis, such as the method described in the present invention.

On the other hand, magnetic field simulations are widely used to investigate, develop and design magnets and magnetic systems. Many magnetic field simulation software packages are commercially available. Most of them use a finite element modeling (FEM) algorithm, allowing the simulation of complex shapes and combinations of magnets and magnetic systems, as well as nonmagnetic materials. Apart from these FEM-based algorithms, analytical expressions also exist for a number of highly symmetric and simple geometrical magnet shapes, such as blocks, spheres, spheroids and ellipsoids. Analytical models can calculate faster than FEM models, but are restricted in the type of magnetic systems they can simulate. For example, they can only simulate magnets with uniform magnetization. Also they cannot simulate systems involving relative permeabilities other than unity.

Analytical models exist e.g. for uniformly magnetized spheres, block magnets (see R. Engel-Herbert and T. Hesjedal, 'Calculation of the magnetic stray field of a uniaxial magnetic domain', JOURNAL OF APPLIED PHYSICS 97, 074504, 2005) and spheroids (see M. Tejedor, H. Rubio, L. Elbaile, and R. Iglesias, 'External Fields Created by Uniformly Magnetized Ellipsoids and Spheroids', IEEE TRANSACTIONS ON MAGNETICS. VOL. 31, NO. I., JANUARY 1995). Other geometries, such as cylinders, rings, segments etc. can be built by building them up from a number of these elementary geometries. Any geometry can e.g. be approximated by a sufficiently large collection of blocks. Since the magnetic fields of a collection of magnets are additive, the magnetic field distributions of all blocks can simply be added together in order to obtain the complete magnetic field distribution.

SUMMARY OF THE INVENTION

Aspects of the present invention are defined in the attached claims. Below certain non-limiting statements are made about embodiments of the present invention.

In one aspect the present invention provides a method for fitting a theoretical simulation model to a set of measured data by optimizing a set of model parameters, characterized in that all or part of the modeling calculation work is performed before the actual optimization procedure is started ('precalculation' or 'precalculated data'). The measured data can be, for example magnetic field values. In a preferred embodiment the measured data are magnetic field values obtained from a magnetic field camera device.

To provide the advantage of calculation speed, the theoretical simulation model can be an analytical model.

Alternatively the theoretical simulation model can be a finite element method (FEM) model.

The optimization scheme can use a linear data-fitting algorithm or a nonlinear data-fitting algorithm The model parameters may include some or all of the following: magnetization vector components, position coordinates, sizes.

In an embodiment the precalculation involves calculating a set of magnetic field distributions.

A variety of options are possible for the optimization procedure such as: making linear combinations of precalculated datasets, interpolation algorithms on the precalculated data, The optimzation scheme can result in a best fit simulated data set and a residual data set which is the difference between the best fit data set and the measured data set.

The present invention may be applied advantageously for inspection and/or quality control of permanent magnets, for inspection and/or quality control of permanent magnets with uniaxial magnetization, for inspection and/or quality control of permanent magnets with multipole magnetization, for inspection and/or quality control of ferromagnetic, paramagnetic, diamagnetic, magnetostrictive and/or superconducting materials and/or materials with other forms of magnetic response, for inspection and/or quality control of electromagnets, for inspection and/or quality control of magnetic assemblies, for inspection and/or quality control of welds, including but not limited to spot welds, projection welds, other resistance welds, laser welds, electron beam welds, arc welds.

In an aspect of the present invention a fast method of combining measured magnetic field maps and theoretical simulations of the measured magnetic system in order to extract information on properties of the measured magnetic system is provided which cannot be obtained by the measurement alone or the simulation alone. It is assumed that the physical magnetic system can be simulated, or at least approximated, by the simulation model, whether the latter be a FEM model, an analytical model or still another type of model.

It is assumed that the simulation model needs a set of input parameters from which to calculate or simulate a magnetic field distribution which can be compared to the measured magnetic field distribution. These input parameters generally are physical properties of the magnetic system, such as, but not limited to, geometry, size, position, magnetization vector or structure, etc. When an optimization procedure is applied, the input parameters usually have initial values from which the optimization procedure is started. The goal of the optimization procedure is to minimize the overall difference between the calculated or simulated magnetic field distribution and the measured magnetic field distribution. This is performed by varying the model input parameters according to an optimization scheme, which allows finding a local or global minimum (if such exists) in the overall difference between the measured and simulated magnetic field distributions. This overall difference can be expressed as the sum of squares of the differences at every data point or as another parameter. The optimization scheme can be linear or nonlinear. Examples of nonlinear optimization schemes are the 'trust-region-reflective' and 'Levenberg-Marquardt' algorithms, which are e.g. used in the 'Isqnonlin' function in Matlab. The final values of the model input parameters after the optimization has been completed, are approximations of the real physical parameters of the magnetic system, and can thus be regarded as measurement results.

The present invention relates to a method of considerably speeding up the above general method of fitting calculated or simulated data to measurement data. The method thereby makes use of precalculated simulation data which need to be calculated only once for a particular magnetic system configuration. During the optimization procedure, the precalculated data is treated using fast algorithms such as, but not limited to, linear combinations and interpolation schemes in order to obtain a best fit to the measured data. The input parameters of the model are thus optimized without the need for resimulating the complete system at every iteration in the optimization procedure.

When an optimization scheme as described above is completed, and all desired parameters for the theoretical model are known, one disposes of the following data: the measured magnetic field distribution; the simulated best fit magnetic field distribution; the residual magnetic field distribution, i.e. the difference between the measured magnetic field distribution and the best fit theoretical distribution; the optimized parameters of the model. These data contain a lot of information on the measured physical system which can be more easily evaluated and analyzed than without the optimization analysis.

BRIEF DESCRIPTION OF THE DRAWINGS

FIG. 7 shows results of an optimization procedure according to the present invention for the magnet of FIG. 6.

EMBODIMENTS OF THE INVENTION

Figure 8:
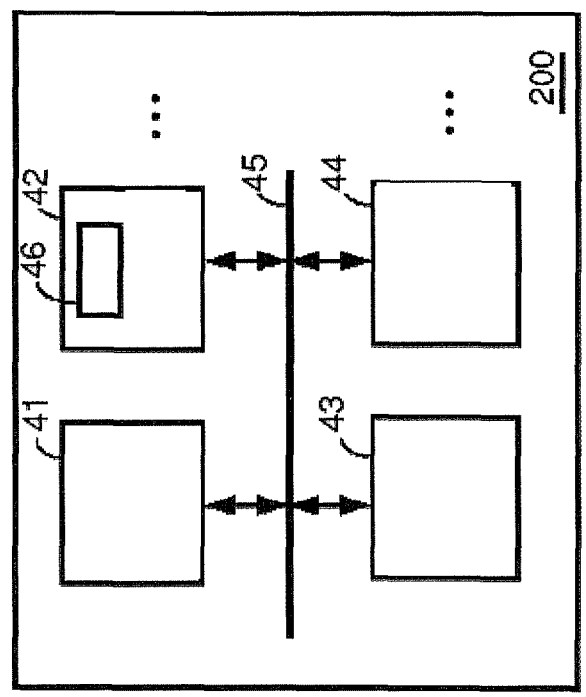
FIG. 8 shows a schematic processing engine arrangement or computer system that can be used with the present invention.

In one embodiment of the present invention, the optimization procedure can be implemented in the following way. Consider a uniformly magnetized magnet with a certain geometrical shape, e.g. a block having three sides a, b and c along the X, Y and Z directions respectively of a Cartesian coordinate system. The magnet is placed with its center at the origin of the coordinate system. A magnetic field camera device (i.e. a magnetic field sensor comprising a two-dimensional array of magnetic field sensors) is placed underneath the magnet in order to record the magnet's magnetic field distribution in the XY plane at a distance d under the magnet (d is in the Z-direction). The magnetic field camera has a sensitive area of A=L*W in the XY plane and records (in this embodiment) only the Z-component of the magnetic field, i.e. $Bz(x,y,z)$, where z is fixed due to the 2D nature of the magnetic field camera. It is assumed that the X- and Y-axes of the coordinate system are parallel to the rows and columns of the sensor array in the magnetic field camera. The goal is to find, among other parameters (see further), the magnetization vector M of the physical block magnet, having components Mx, My and Mz along the three coordinate axes respectively. When the other input parameters of the model are (approximately) known, except for M, the following procedure can be applied. It is assumed that the magnetic field distribution of a magnet with magnetization M=(Mx,My,Mz) can be expressed as a linear combination of three magnetic field distributions, each generated by a magnet with a magnetization corresponding to one component of M:

$$Bz(x, y, z)(Mx, My, Mz) = \\ Bz(x, y, z)(Mx, 0, 0) + Bz(x, y, z)(0, My, 0) + Bz(x, y, z)(0, 0, Mz) = \\ Mx*Bz(x, y, z)(1, 0, 0) + \\ My*Bz(x, y, z)(0, 1, 0) + Mz*Bz(x, y, z)(0, 0, 1) \quad (1)$$

with Bz(x,y,z)(Mx,My,Mz) the z-component of the magnetic field vector at position (x,y,z) generated by a magnet with magnetization vector M=(Mx,My,Mz). In (1) a linear relationship between B and M is assumed, i.e. B(M)=M*B (1), where B(M) is the magnetic field generated by a magnet with magnetization M.

While the unknown parameters in the optimization procedure are Mx, My and Mz, the values (distributions) of Bz(x,y,z)(1,0,0), Bz(x,y,z)(0,1,0) and Bz(x,y,z)(0,0,1) can be calculated on beforehand, i.e. before the optimization procedure starts. These values are in fact complete magnetic field distributions which can take a long time to compute, especially when FEM models are used and/or when a large area is covered and when the spatial resolution is large. Moreover, these magnetic field distributions only need to be calculated once for each magnet geometry or magnetic system configuration. The optimization then only involves finding the optimal values of Mx, My and Mz for which the linear combination (1) is optimized with respect to the measured magnetic field distribution. This procedure allows to perform e.g. fast inline inspections of many similar magnets, for which the precalculation needs only be performed once.

In another embodiment of the invention, when other parameters are also unknown, the fast optimization scheme above can be applied in the following way. Suppose the following parameters are unknown for the same setup as the previous embodiment: M=(Mx,My,Mz), a, b, X_position, Y_position, Alpha_position, where M=(Mx,My,Mz) is the magnetization vector of the measured magnet;

a and b are the lateral sizes of the measured magnet;

X_position and Y_position are the exact position in the XY plane of the center of the measured magnet;

Alpha_position is the angular position of the measured magnet in the XY-plane, i.e. the angle that the a- and b-axes make with the X- an Y-axes of the coordinate system (which are parallel to the sensor axes in the camera array).

When the above parameters are unknown, the precalculated magnetic field distributions can still be used to do a fast optimization without having to recalculate or resimulate any magnetic field. This can be accomplished using a sequential optimization and/or a simultaneous optimization of (a subset of) the different parameters. Here we describe the general method to perform the optimization for each parameter separately. In practice more parameters are optimized simultaneously to obtain better results.

Suppose a first approximation has already been found for M=(Mx,My,Mz). Generally, the physical magnet will not be positioned in the exact origin of the coordinate system, but will have its center at an unknown position (X_position, Y_position) in the XY plane. Suppose the calculated magnetic field maps Bz(x,y,z)(1,0,0), Bz(x,y,z)(0,1,0) and Bz(x,y,z)(0,0,1) are calculated on an area larger than the sensor area of the magnetic field camera. Using the already found approximated Mx, My, Mz values, the magnetic field map for the magnet in the origin of the coordinate system is approximately known. The measured magnetic field map, however, has an offset in the XY-plane relative to the calculated map. The procedure now consists in shifting the calculated map over a vector (X_shift, Y_shift) and finding the values for X_shift and Y_shift for which the overlap of the measured and calculated maps is optimal. In practice this is done in the following way. For a general shift (X_shift, Y_shift) of the calculated map over the measured map, the positions of the data points of both maps will not coincide. Therefore, the theoretical map is interpolated as to calculate the theoretical magnetic field values at the points that correspond to data points in the measured map. This allows to directly subtract the theoretical and measured maps and calculate the sum of squares. One essential point here is that interpolating is a much faster process than simulating the magnetic field. Therefore, this interpolation process can be performed sequentially for several shifts (X_shift, Y_shift) until an optimum is found. The optimized values of (X_shift, Y_shift)=(X_position, Y_position) than indicate the physical position of the magnet.

In practice, (X_shift, Y_shift) can be optimized simultaneously with Mx, My, Mz.

In another embodiment of the invention, it is than straightforward to extend the previous process to the parameter Alpha_position in the following way. Generally, the physical magnet will not have its a- and b-axes exactly aligned with the X- and Y-axes, but will be rotated over an angle Alpha_position in the XY-plane. Once (X_position, Y_position) is known, the calculated map can be rotated around the point (X_position, Y_position) over an angle Alpha in order to find an optimized overlap with the measured map. A similar interpolation scheme as in the previous embodiment can be applied in this case.

When an optimum is found, the optimized value of Alpha corresponds to Alpha_position, i.e. the rotation angle of the magnet in the XY-plane. In practice, Alpha_position is optimized simultaneously with Mx, My, Mz and possibly again with (X_position, Y_position) in order to obtain optimal results. Since the starting parameters from the previous iteration (without Alpha) are already good approximations, taking these parameters into the optimization once again does not add a lot of calculation time to the algorithm.

In another embodiment of the invention, to go one step further, once optimized values for Mx, My, Mz, X_position, Y_position and Alpha_position are found, also the lateral dimensions of the magnet (in this case a and b) can be optimized for a best fit. This procedure, however, does not yield exact results and is an approximation, since for changed magnet dimensions, the magnetic field distribution would in principle need to be recalculated. For small deviations from the initial values, however, this method works sufficiently accurately and is much faster than recalculating the complete magnetic field distributions. The method for optimizing the magnet dimensions is explained in what follows. With the aforementioned other parameters optimized and known, the parameters a and b can optimized by 'stretching' or 'compressing' the calculated magnetic field maps in order to match better with the measured map. This is performed by applying scaling factors (in both X and Y directions) to the calculation grid. It is these scaling factors that are in fact optimized. Deviding the initial a and b values (or other dimensional values) by the optimized scaling factors, yields the optimized dimensions.

In another embodiment one can choose which parameters to include in the optimization procedure and which ones to keep constant at their initial values.

When an optimization scheme as described in the above embodiments is completed, and all desired parameters for the theoretical model are known, one disposes of the following data: the measured magnetic field distribution; the simulated best fit magnetic field distribution; the residual magnetic field distribution, i.e. the difference between the measured magnetic field distribution and the best fit theoretical distribution; the optimized parameters of the model. These data contain a lot of information on the measured physical system. Below are described a number of embodiments of the present invention where these resulting data are used for certain applications.

In one embodiment one can use the optimized parameters as measured characteristics of the physical system. For example, the optimized magnetization vector M=(Mx,My,Mz) gives information about its size: size(M)=sqrt(Mx^2+My^2+Mz^2). It also give information about its deviation from the geometrical magnetization axis. Suppose the magnet is supposedly magnetized along its c-axis (in the Z-direction). The optimization procedure described above may yield M=(Mx,My,Mz) in which Mz will be largest, but with some nonzero values for Mx and My. By converting (Mx, My,Mz) from Cartesian to spherical coordinates (M, theta, phi), one readily obtains the magnitude of M, as well as its deviation angle from the c-axis (theta) and the angle of its projection in the XY-plane (phi). In particular the values for M and theta are important quality-determining characteristics of uniaxially magnetized permanent magnets and can, using the present invention, be readily obtained and evaluated during an inspection.

In another embodiment of the invention, the optimized position (including angular position) of the magnet in the XY-plane can be used to e.g. make accurate position measurements of an object, or to actively position an object using the optimization scheme as a feed-back system.

In another embodiment the residual image can be analyzed to detect imperfections in the physical magnet or in its magnetization structure. E.g. inhomogeneities in the magnetic field distribution that may not be apparent in the original measured magnetic field map can become visible in the residual map. These can indicate internal cracks or inclusions in the magnet, areas where the magnetic properties are different, defects in the magnetization etc. On this residual image a statistical image analysis could be performed yielding quantitative parameters that can be used for e.g. a pass/fail quality control.

In another embodiment, a reference magnet, which is regarded as a 'good' magnet, can be analyzed using the optimization scheme of the present invention. The resulting theoretical map can then be used for comparison to other similar magnets whose quality needs to be determined. Instead of comparing directly to a 'good but not perfect' magnet (no magnet is perfect), the magnet is made perfect by finding a best fit theoretical equivalent. In this theoretical equivalent, imperfections can be removed to make the reference magnet even more perfect. Suppose, for example, that the magnet has a magnetization along the c-direction (Z-direction), but the optimization analysis shows some Mx and My components. These components can be removed after the optimization analysis, whilst keeping all other optimized parameters constant and recalculate the magnetic field distribution, but with Mx and My set equal to zero.

In another embodiment, all of the aforementioned applies to all magnet shapes other than block magnets, including but not limited to cylindrical magnets, ring magnets, ring segment magnets, more complex shapes etc.

In another embodiment all of the above applies to combinations of more than one magnet, magnetic assemblies and magnetic systems, products involving magnetic systems etc.

In another embodiment, all of the above applies to magnetic field distributions measured using a MagCam magnetic field camera device. The MagCam magnetic field camera can record the magnetic field map without moving, i.e. by measuring its sensitive area, or it can be mechanically scanned in order to cover a larger area.

In another embodiment, all of the above applies to magnetic field distributions measured using a discrete magnetic field sensor which is mechanically scanned over the magnetic system in order to obtain a magnetic field distribution. The discrete magnetic field sensor can be, but is not limited to, one of the following types or combinations thereof: a Hall effect sensor, a magnetoresistive sensor (AMR, GMR, TMR), a SQUID sensor, a fluxgate sensor, an NMR sensor etc.

In another embodiment, the measured magnetic field map is obtained by stitching multiple magnetic field distribution maps together using image stitching algorithms.

In another embodiment the above is applied to soft magnetic materials which are being magnetized using an external magnetic field.

In another embodiment the above is applied to welds in magnetic materials such as, but not limited to, steel, nickel, cobalt. The welds can include, but are not limited to, one of the following types: spot welds, projection welds, other resistance welds, laser welds, electron beam welds, arc welds etc.

In one embodiment of the above a spot weld is magnetized using a DC magnetic field and the magnetic field distribution in the vicinity of the spot weld is measured using a magnetic field camera or other magnetic field mapping device. An optimization algorithm according to the present invention is applied to this measured magnetic field map. The simulation model can be any model able to calculate a magnetic field distribution of a magnetized spot weld. The spot weld can be magnetized along any direction, including in the plane of the weld and perpendicular to the weld.

In another embodiment the principle of precalculating magnetic field distributions applies to other physical properties that can be simulated and measured.

EXAMPLES

Below are some examples of applying the present invention to permanent magnets.

Figure 1:
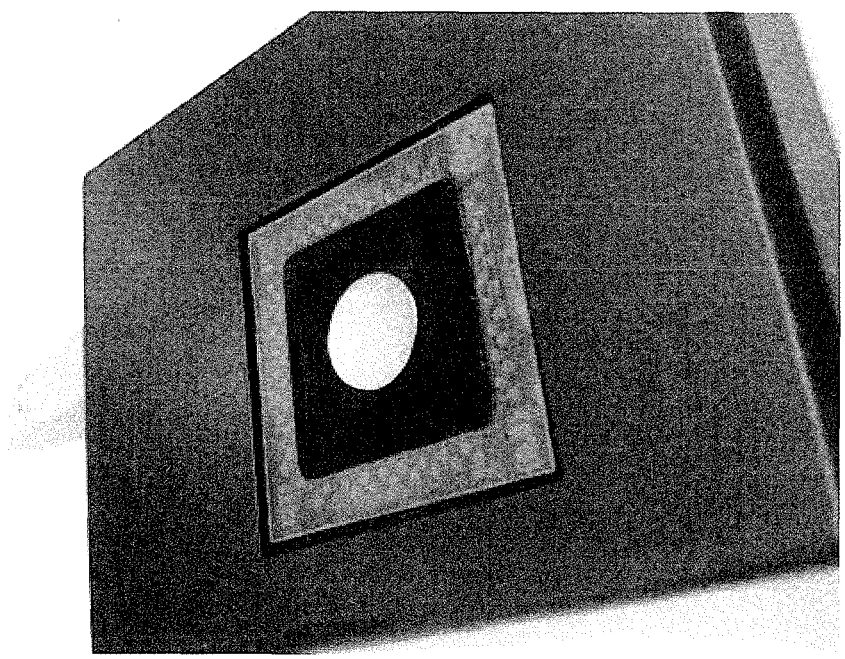
FIG. 1 shows a cylindrical magnet with axial magnetization placed on a magnetic field camera measurement device with Hall magnetic field sensors

FIG. 1: Cylindrical magnet with axial magnetization placed on a magnetic field camera measurement device with 128×128 Hall magnetic field sensors on an area of 13 mm*13 mm (=16384 sensors). The complete array is measured in less than one second.

Figure 2:
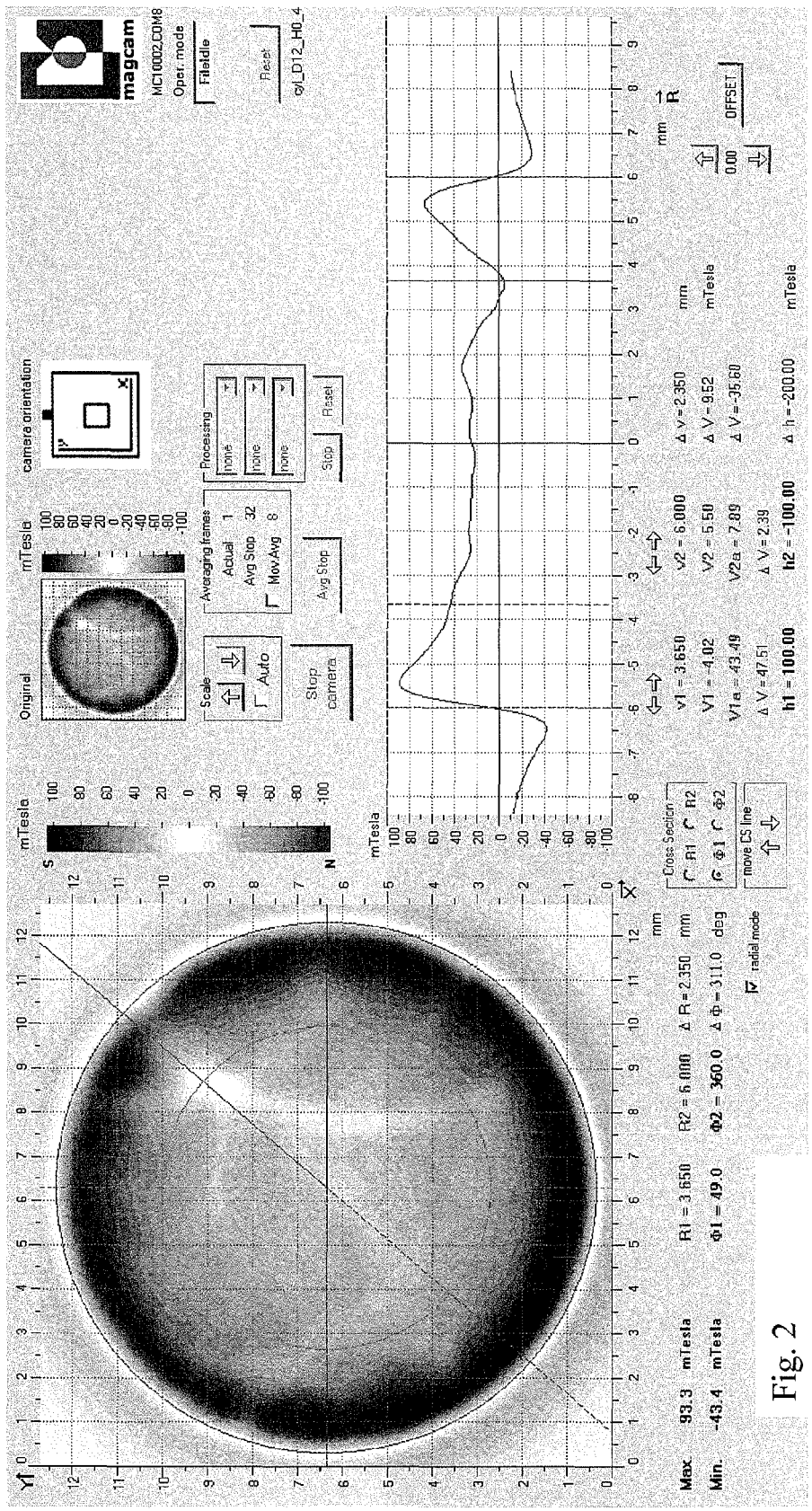
FIG. 2: illustrates a measured magnetic field distribution of the magnet shown in FIG. 1. The measured magnetic field component is the Bz component, perpendicular to the magnetic field camera sensor.

FIG. 2: Measured magnetic field distribution of the magnet shown in FIG. 1. The measured magnetic field component is the Bz component, perpendicular to the magnetic field camera sensor.

Figure 3:
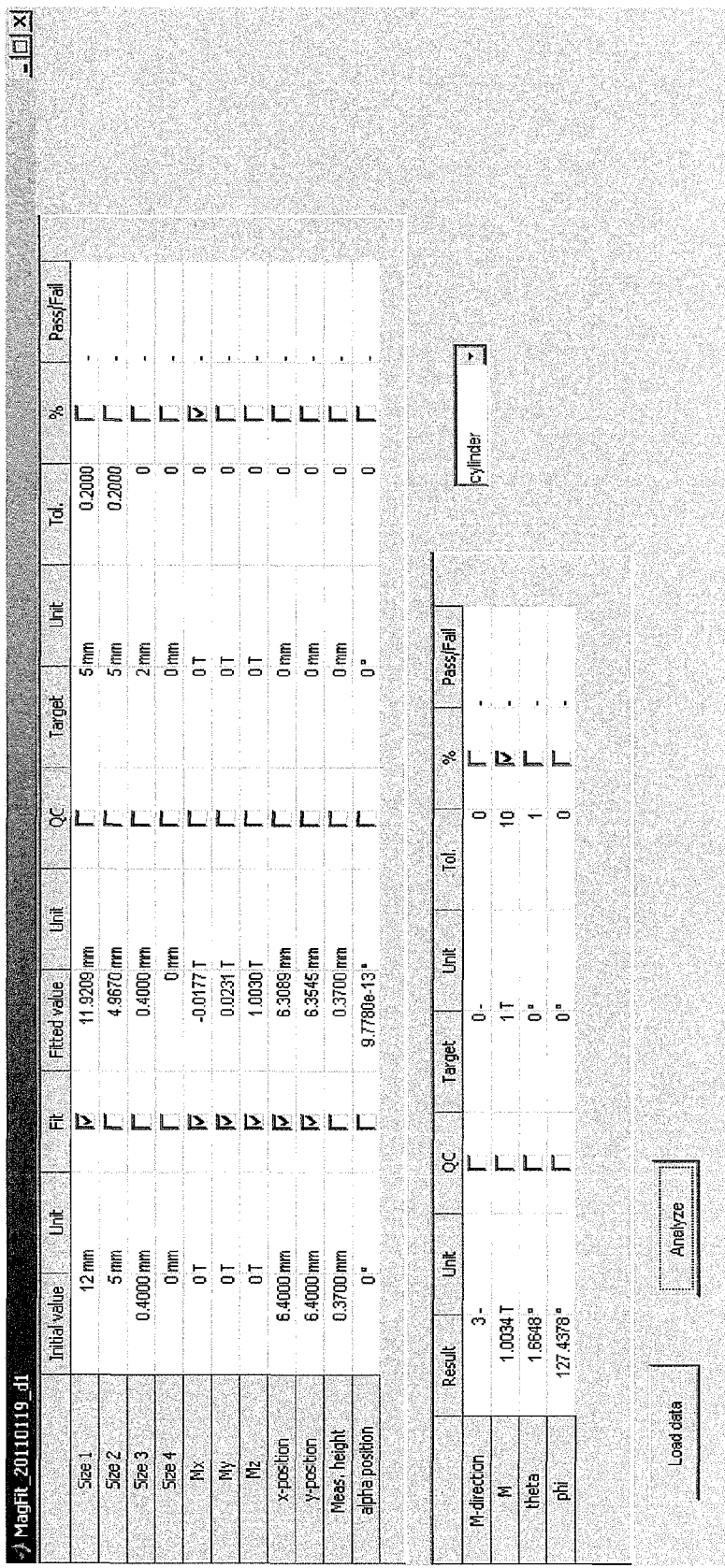
FIG. 3 shows results of an optimization procedure according to the present invention for the magnet of FIG. 1 and FIG. 2.

FIG. 3: Results of an optimization procedure according to the present invention for the magnet of FIG. 1 and FIG. 2. The measurement data is loaded using the 'Load data' button. For the analysis, the magnet geometry is selected in the drop-down box on the right ('cylinder'). The first column of the larger table ('Initial value') shows the initial values (starting values) for the optimization procedure. Based on these initial values, precalculated simulated magnetic field distributions are loaded from a library, or are calculated if they don't exist yet. The parameter names are shown on the left. The third column ('Fit') allows to choose which parameters to include in the optimization and which to keep fixed. The optimization procedure is started using the 'Analyze' button. After the process is completed, the 'Fitted value' column shows the optimized values for the selected fitting parameters. In this example the fitted parameters include: the diameter of the cylinder ('Size 1'), the magnetization vector components (Mx,My,Mz), and the position of the magnet center in the XY plane ('x-position' and 'y-position'). Note that the largest magnetization component is Mz, with nonzero values for Mx and My. These nonzero values result in a deviation angle (theta) of the magnetization vector from the main magnetization axis (the Z-axis). This is shown in the smaller table below, where the magnetization vector is expressed in spherical coordinates. The quantitative optimized fitting parameters (and deduced parameters such as the spherical coordinates of the magnetization vector) can be included in a pass/fail analysis where a target value and tolerance interval can be set for each parameter (see columns 'QC', 'Target', 'Tol.' and 'Pass/Fail'). The complete analysis using the precalculated scheme takes no more than two seconds.

Figure 4:
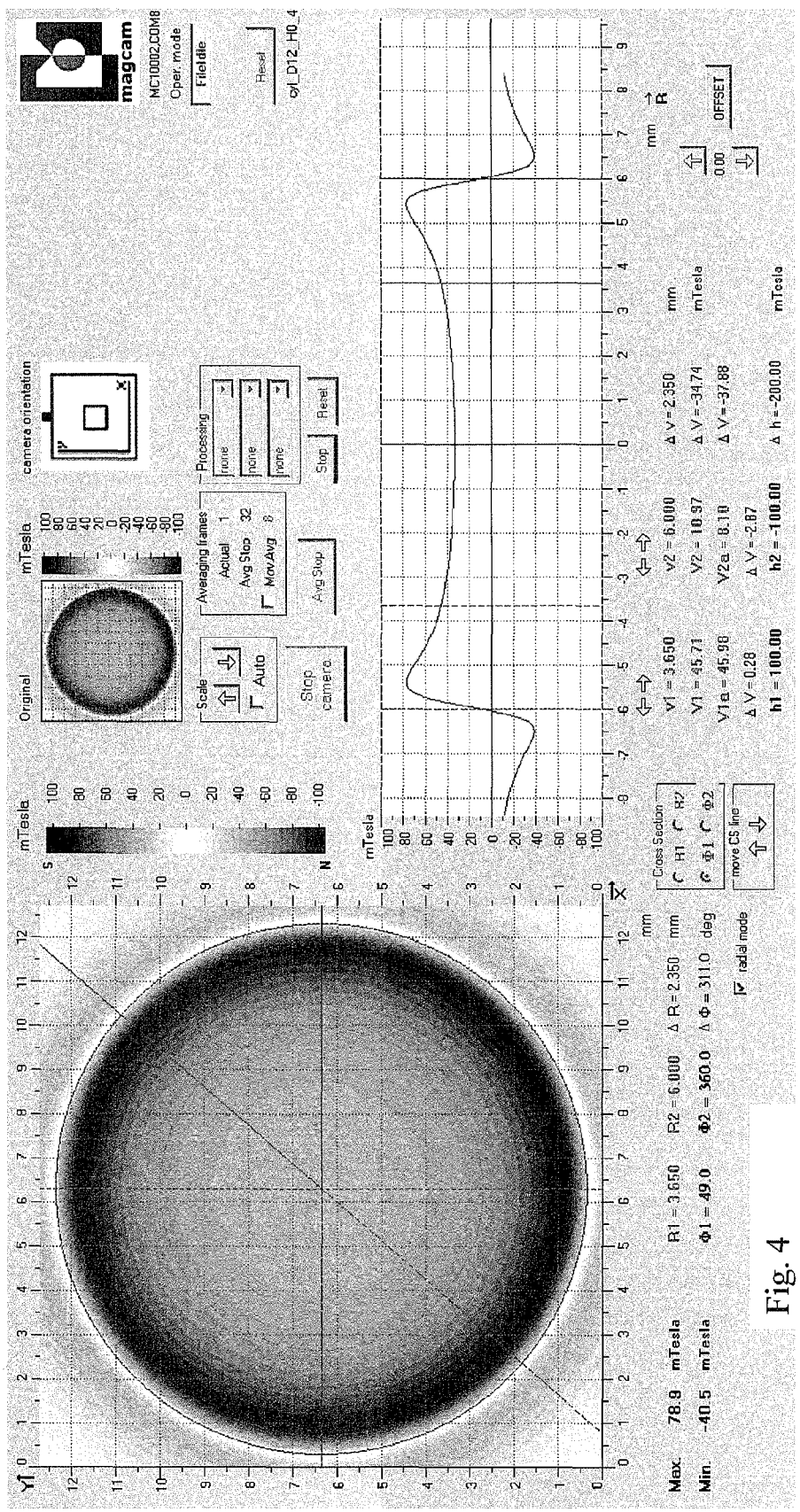
FIG. 4 shows a theoretical best fit magnetic field distribution of the magnet in FIG. 1 and FIG. 2.

FIG. 4: Theoretical best fit magnetic field distribution of the magnet in FIG. 1 and FIG. 2. The optimized parameters are those of FIG. 3. This is a 'perfect' theoretical magnetic field distribution.

Figure 5:
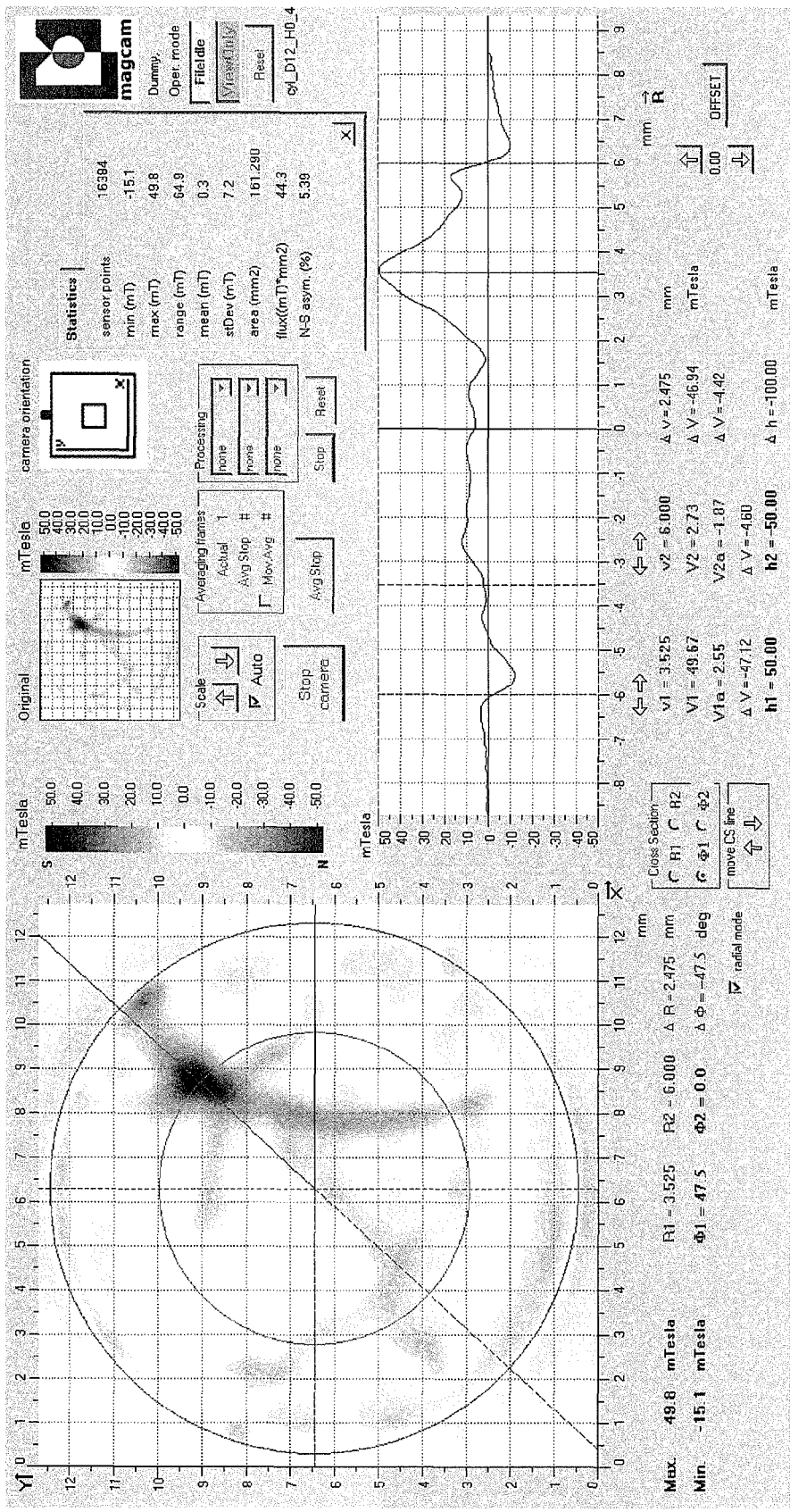
FIG. 5 shows a residual magnetic field distribution (fit—measured data), resulting from the analysis in the foregoing figures.

FIG. 5: Residual magnetic field distribution (fit—measured data), resulting from the analysis in the foregoing figures. This residual map shows all 'imperfections' in the measured magnet, i.e. all features in the magnetic field distribution that deviate from the 'perfect' simulated magnetic field distribution of FIG. 4. This residual figure allows such analyses as material defect detection and characterization, magnetic field (in)homogeneity analysis etc. Concerning the latter, since the magnetic field background due to the 'perfect' magnet is removed, image statistics on the residual image give relevant information on the (in)homogeneity of the magnet with respect to the perfect magnet, as seen in the 'Statistics' frame at the top right. Useful values that can be used for e.g. a pass/fail analysis include minimum and maximum fields, range, mean, standard deviation, north-south asymmetry etc.

Figure 6:
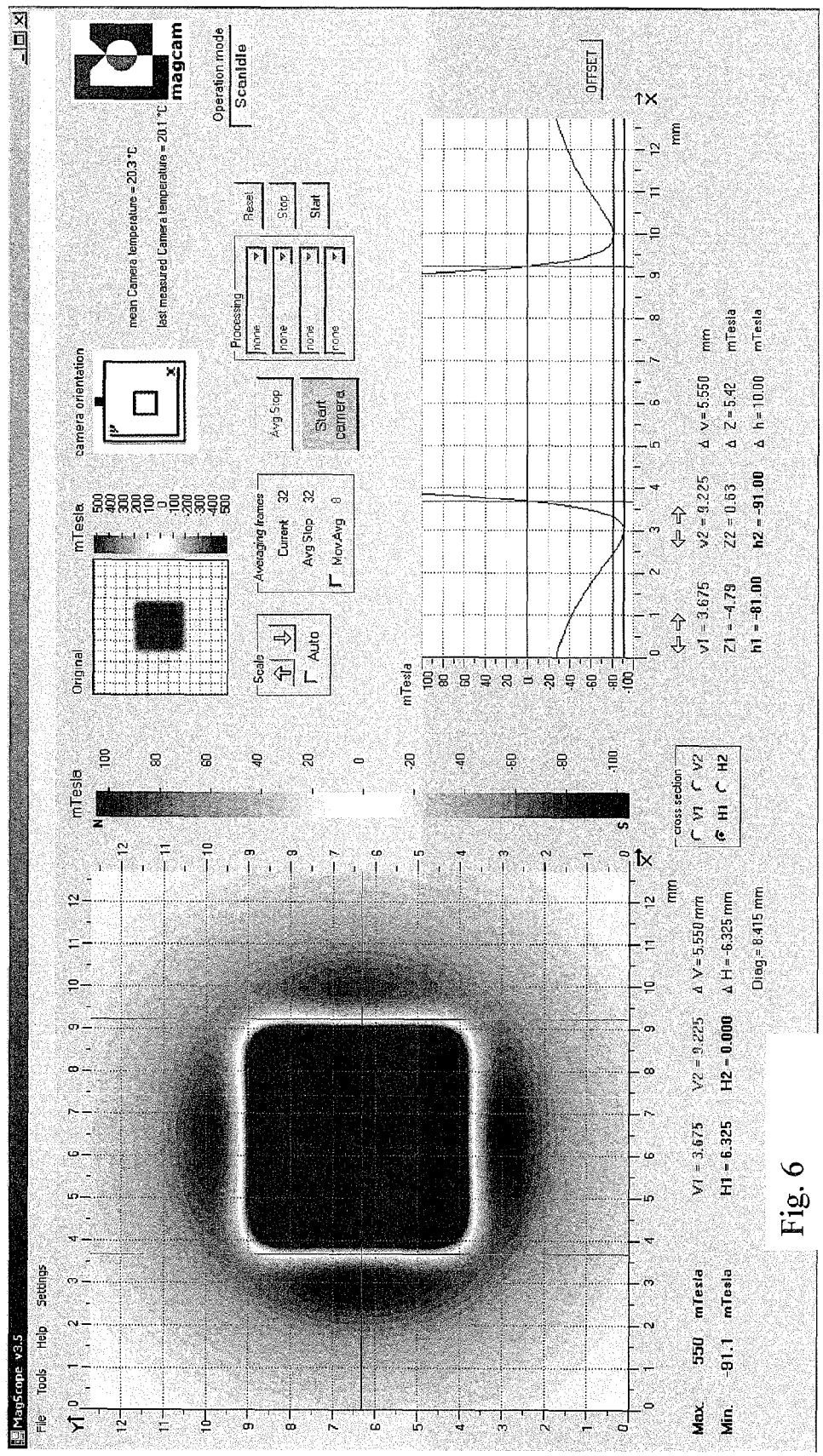
FIG. 6 shows a measured magnetic field distribution of a block magnet with a=b=5 mm and c=2 mm. The measured magnetic field component is the Bz component, perpendicular to the magnetic field camera sensor.

FIG. 6: Measured magnetic field distribution of a block magnet with a=b=5 mm and c=2 mm. The measured magnetic field component is the Bz component, perpendicular to the magnetic field camera sensor.

Figure 7:
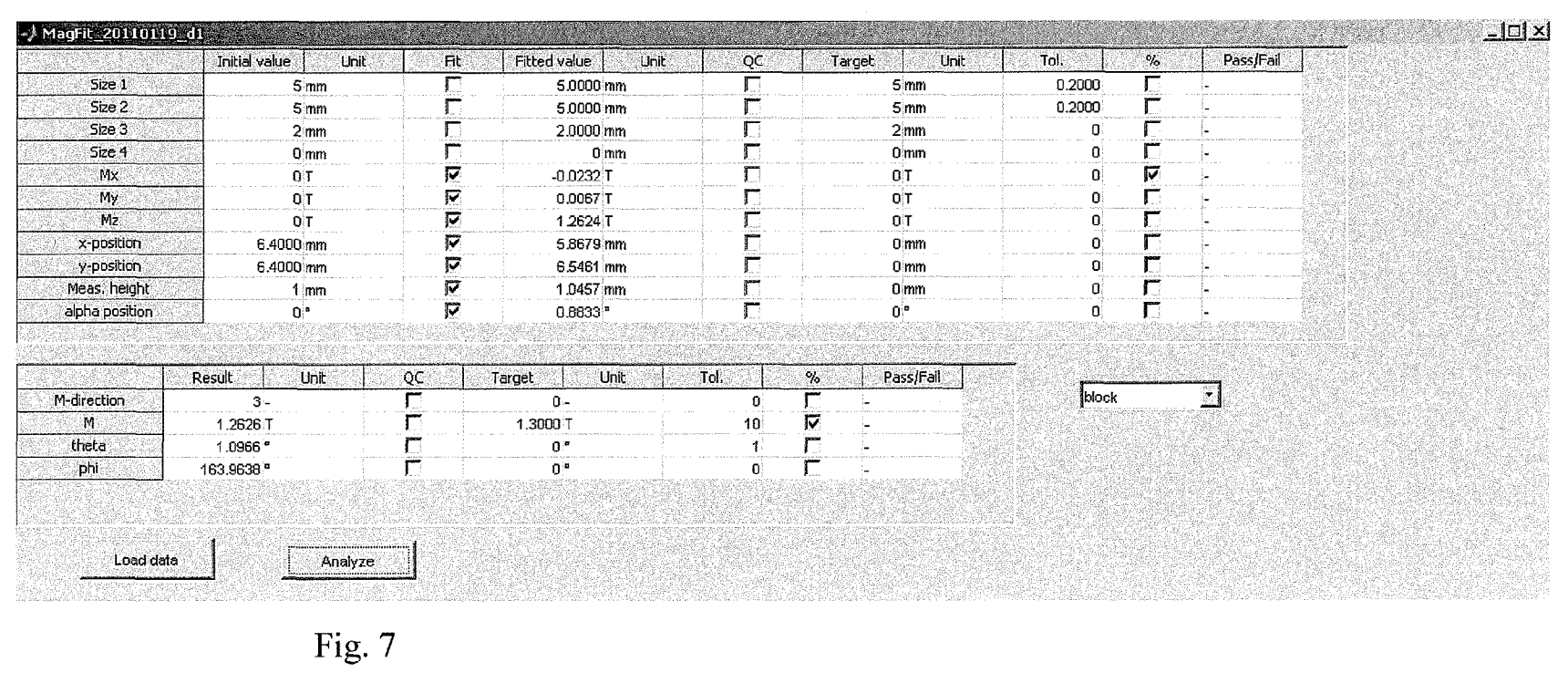

FIG. 7: Results of an optimization procedure according to the present invention for the magnet of FIG. 6. The measurement data is loaded using the 'Load data' button. For the analysis, the magnet geometry is selected in the drop-down box on the right (block). The first column of the larger table ('Initial value') shows the initial values (starting values) for the optimization procedure. Based on these initial values, precalculated simulated magnetic field distributions are loaded from a library, or are calculated if they don't exist yet. The parameter names are shown on the left. The third column ('Fit') allows to choose which parameters to include in the optimization and which to keep fixed. The 'Fitted value' column shows the optimized values for the selected fitting parameters. In this example the fitted parameters include: the magnetization vector components (Mx,My,Mz), the position of the magnet center in the XY plane ('x-position' and 'y-position'). Note that the largest magnetization component is Mz, with nonzero values for Mx and My. These nonzero values result in a deviation angle (theta) of the magnetization vector from the main magnetization axis (the Z-axis), as shown in the smaller table below, where the magnetization vector is expressed in spherical coordinates. The quantitative optimized fitting parameters (and deduced parameters such as the spherical coordinates of the magnetization vector) can be included in a pass/fail analysis where a target value and tolerance interval can be set (see columns 'QC', 'Target', 'Tol.' and 'Pass/Fail'). The complete analysis using the precalculated scheme takes no more than two seconds.

The methods described above according to embodiments of the present invention may be implemented in a processing system 200 such as shown in FIG. 8 schematically. FIG. 8 shows one configuration of processing system 200 that includes at least one customisable or programmable processor 41 coupled to a memory subsystem 42 that includes at least one form of memory, e.g., RAM, ROM, and so forth. It is to be noted that the processor 41 or processors may be a general purpose, or a special purpose processor, and may be for inclusion in a device, e.g., a chip that has other components that perform other functions. Thus, one or more aspects of the method according to embodiments of the present invention can be implemented in digital electronic circuitry, or in computer hardware, firmware, software, or in combinations of them. The processing system may include a storage subsystem 43 that has at least one disk drive and/or CD-ROM drive and/or DVD drive. In some implementations a user interface subsystem 44 may be provided for a user to manually input information or adjust the operation. More elements such as network connections, interfaces to various devices, and so forth, may be included in some embodiments, but are not illustrated in FIG. 8. In particular an interface is provided to receive the output of a magnetic field camera as described above. The various elements of the processing system 40 may be coupled in various ways, including via a bus subsystem 45 shown in FIG. 8 for simplicity as a single bus, but will be understood to those in the art to include a system of at least one bus. The memory of the memory subsystem 42 may at some time hold part or all (in either case shown as 46) of a set of instructions that when executed on the processing system 40 implement the steps of the method embodiments described herein.

The present invention also includes a computer program product which provides the functionality of any of the methods according to embodiments of the present invention when executed on a computing device. Such computer program product can be tangibly embodied non-transiently in a carrier medium carrying machine-readable code for execution by a programmable processor. The present invention thus relates to a carrier medium carrying a computer program product that, when executed on computing means, provides instructions for executing any of the methods as described above. The term "carrier medium" refers to any medium that participates in providing instructions to a processor for execution. Such a medium may take many forms, including but not limited to, non-volatile media, and transmission media. Non-volatile media includes, for example, optical or magnetic disks, such as a storage device which is part of mass storage. Common forms of computer readable media include, a CD-ROM, a DVD, a flexible disk or floppy disk, a tape, a memory chip or cartridge or any other medium from which a computer can read. Various forms of computer readable media may be involved in carrying one or more sequences of one or more instructions to a processor for execution. The computer program product can also be transmitted via a carrier wave in a network, such as a LAN, a WAN or the Internet. Transmission media can take the form of acoustic or light waves, such as those generated during radio wave and infrared data communications. Transmission media include coaxial cables, copper wire and fibre optics, including the wires that comprise a bus within a computer.

Accordingly, the present invention also includes a software product which when executed on a suitable computing device carries out any of the methods of the present invention. Suitable software can be obtained by programming in a suitable high level language such as C and compiling on a suitable compiler for the target computer processor. Target computer processor can be (for example but not limited to): the general purpose processor (CPU) in a computer system, a graphical processor (such as a GPU) of a computer system, a general purpose processor present in a display system, a graphical processor (such as a GPU) present in a display system, an embedded processor present in a display system, a processor present in a panel such as a LCD panel or OLED panel or plasma panel, a processor present in the driver system of a liquid crystal display panel.

Accordingly the present invention provides a computer program product for characterizing magnetic systems based on an initialized set of input parameters of the magnetic system, code segments, when executed on a processing engine, can be adapted to allow for measuring the magnetic field distribution, and for determining an optimal expected magnetic field distribution of the magnetic system.

In another aspect the present invention provides a computer program product for a method for fitting a theoretical simulation model to a set of measured data by optimizing a set of model parameters, characterized in that all or part of the modeling calculation work is performed before the actual optimization procedure is started ('precalculation' or 'precalculated data'). The measured data can be, for example magnetic field values. In a preferred embodiment the measured data are magnetic field values obtained from a magnetic field camera device.

The code segments, when executed on a processing engine, can be adapted to allow the determining of said expected magnetic field distribution, to include:
i) determining a calculated magnetic field distribution using a theoretical simulation model,
ii) comparing said expected magnetic field distribution to said measured magnetic field distribution value,
iii) using an optimization scheme to obtain the expected magnetic field distribution of the magnetic system,
iv) repeating steps i), ii) and iii) until the expected magnetic field distribution is the same as the measured magnetic field distribution value within a tolerance.

The code segments, when executed on a processing engine, can be adapted to allow the theoretical simulation model to be an analytical model.

The code segments, when executed on a processing engine, can be adapted to allow the theoretical simulation model to be a finite element method model.

The code segments, when executed on a processing engine, can be adapted to allow the optimization scheme to use a linear data-fitting algorithm.

The code segments, when executed on a processing engine, can be adapted to allow the optimization scheme to use a nonlinear data-fitting algorithm.

The code segments, when executed on a processing engine, can be adapted to allow the optimization scheme to use interpolation algorithms.

The code segments, when executed on a processing engine, can be adapted to allow the optimization scheme i to use linear combinations of precalculated datasets.

The invention claimed is:

1. An arrangement for characterizing magnetic systems based on an initialized set of input parameters of the magnetic system, the arrangement comprising:
a magnetic field sensor for measuring the magnetic field distribution of the magnetic system of a magnet,
means for determining an optimal expected magnetic field distribution of the magnetic system by optimizing one or more parameter(s) selected from the set of input parameters of the magnetic system, wherein said means for determining said optimal expected magnetic field distribution comprises i) means for determining an expected magnetic field distribution using a theoretical simulation model and based on said set of input parameters, said expected magnetic field distribution comprising precalculated simulation data, ii) means for comparing said expected magnetic field distribution to said measured magnetic field distribution value, and iii) means for using an optimization scheme to obtain an optimized expected magnetic field distribution of the magnetic system,
means for comparing said optimal expected magnetic field distribution of the magnetic system to the measured magnetic field distribution of the magnetic system by forming a residual image, and
means for performing statistical image analysis on the residual image to yield quantitative parameters reflecting imperfections and/or quality of the magnetic system and to determine whether the magnetic system passes or fails a quality control.

2. An arrangement according to claim 1, wherein the magnetic field sensor is a magnetic field camera device.

3. An arrangement according to claim 1, in which the input parameters include at least one of the following: magnetization vector components, position coordinates or dimensions.

4. An arrangement according to claim 1, in which the theoretical simulation model is selected from the group comprising an analytical model and a finite element method model.

5. An arrangement according to claim 1, in which the optimization scheme makes use of any of the following: a linear data-fitting algorithm, a nonlinear data-fitting algorithm, interpolation algorithms, and linear combinations of precalculated datasets.

6. Method for characterizing magnetic systems based on an initialized set of input parameters of the magnetic system, comprising the steps of:
placing a magnetic sensor underneath a magnetic system;
measuring the magnetic field distribution of the magnetic system of a magnet by measuring data that are magnetic field values,
determining an optimal expected magnetic field distribution of the magnetic system by optimizing one or more input parameters selected from among said set of input parameters of the magnetic system, wherein determining said expected magnetic field distribution comprises the steps of i) from said initialized value of said input parameters, determining an expected magnetic field distribution using a theoretical simulation model and based on said set of input parameters, said expected magnetic field distribution comprising precalculated simulation data, ii) comparing said expected magnetic field distribution to said measured magnetic field distribution value, iii) using an optimization scheme to obtain an optimized expected magnetic field distribution of the magnetic system, and iv) repeating steps i), ii) and iii) until the expected magnetic field distribution is the same as the measured magnetic field distribution value within a tolerance,
comparing the optimal expected magnetic field distribution of the magnetic system to the measured magnetic field distribution of the magnetic system by forming a residual image, and
performing statistical image analysis on the residual image to yield quantitative parameters reflecting imperfections and/or quality of the magnetic system and to determine whether the magnetic system passes of fails a quality control.

7. A method according to claim 6, in which the measured data are magnetic field values obtained from a magnetic field camera device.

8. A method according to claim 6, in which the input parameters include at least one of the following: magnetization vector components, position coordinates or dimensions.

9. A method according to claim 6, in which the theoretical simulation model is selected from an analytical model, and a finite element method model.

10. A method according to claim 6, in which the optimization scheme make use of any of the following: a linear data-fitting algorithm, a nonlinear data-fitting algorithm, interpolation algorithms, linear combinations of precalculated datasets.

11. The method according to claim 6 wherein the inspection and/or quality control is of the following: permanent magnets, permanent magnets with uniaxial magnetization, permanent magnets with multipole magnetization, ferromagnetic, paramagnetic, diamagnetic, magnetostrictive and/or superconducting materials and/or materials with other forms of magnetic response, electromagnets, magnetic assemblies, welds, spot welds, projection welds, other resistance welds, laser welds, electron beam welds, and arc welds.

12. A non-transitory signal storage medium storing a computer program product for characterizing magnetic systems based on an initialized set of input parameters of the magnetic system, having code segments, which when executed on a processing engine, being adapted to allow for measuring the magnetic field distribution of the magnetic system of a magnet, for determining an optimal expected magnetic field distribution of the magnetic system by optimizing one or more input parameters selected from among said set of input parameters, for comparing the optimal expected magnetic field distribution of the magnetic system to the measured magnetic field distribution of the magnetic system by forming a residual image, and for performing statistical image analysis on the residual image to yield quantitative parameters reflecting imperfections and/or quality of the magnetic system, wherein the code segments are adapted to allow the determining of said expected magnetic field distribution, for i) determining an expected magnetic field distribution using a theoretical simulation model and based on said set of input parameters, said expected magnetic field distribution comprising precalculated simulation data, ii) comparing said expected magnetic field distribution to said measured magnetic field distribution value, iii) using an optimization scheme to obtain an optimized magnetic field distribution of the magnetic system, and iv) repeating steps i), ii) and iii) until the expected magnetic field distribution is the same as the measured magnetic field distribution value within a tolerance.

13. The non-transitory medium according to claim 12 wherein the code segments, are adapted to allow the theoretical simulation model to be selected from an analytical model and a finite element method model.

14. The non-transitory medium according to claim 12 wherein the code segments are adapted to allow the optimization scheme to use an algorithm selected from a linear data-fitting algorithm, a nonlinear data-fitting algorithm, an interpolation algorithm, and linear combinations of precalculated datasets.

15. The method according to claim 6, further comprising the step of extracting information from the optimization scheme for the inspection and/or quality control of the magnetic system.

16. The method according to claim 6, further comprising the step of determining a quality characteristic or imperfection of the magnetic system based on the optimal expected magnetic field distribution.

17. The method according to claim 6, wherein the magnetic system is a spot weld and further comprises an initial step of magnetizing the spot weld using a DC magnetic field.

* * * * *